United States Patent [19]
Thurfjell et al.

[11] Patent Number: 5,044,752
[45] Date of Patent: Sep. 3, 1991

[54] APPARATUS AND PROCESS FOR POSITIONING WAFERS IN RECEIVING DEVICES

[75] Inventors: Henrik Thurfjell, Sunnyvale; Robert G. Ozarski, Livermore, both of Calif.

[73] Assignee: General Signal Corporation, Stamford, Conn.

[21] Appl. No.: 374,410

[22] Filed: Jun. 30, 1989

[51] Int. Cl.$^5$ ...................... G01B 11/00; B65B 21/02
[52] U.S. Cl. ................................... 356/400; 414/416; 250/548; 250/561
[58] Field of Search ............... 414/787, 786, 416, 404, 414/754, 774, 783; 356/400, 401; 250/561, 548

[56] References Cited

U.S. PATENT DOCUMENTS

| | | | |
|---|---|---|---|
| 4,024,944 | 5/1977 | Adams et al. | 198/394 |
| 4,493,606 | 1/1985 | Foulke et al. | 414/787 |
| 4,682,928 | 7/1987 | Foulke et al. | 414/737 |
| 4,713,551 | 12/1987 | Layman et al. | 250/561 |
| 4,761,561 | 9/1988 | Fujiwara et al. | 250/548 |
| 4,765,793 | 8/1988 | Goddeau | 414/416 |
| 4,770,590 | 9/1988 | Hugues et al. | 414/786 |
| 4,907,035 | 3/1990 | Galburt et al. | 356/400 |

Primary Examiner—F. L. Evans
Assistant Examiner—K. P. Hantis
Attorney, Agent, or Firm—John F. Ohlandt

[57] ABSTRACT

An apparatus is provided for loading and/or unloading wafers from a holding cassette to a quartz boat without scraping the wafer on the slots contained in the quartz boat; the apparatus comprising a robot and a paddle. The improvement resides in the main feature of wafer sensor means disposed on the surface of the paddle, the wafer sensor means being connected to a microprocessor which converts and digitizes an analog signal from the wafer sensor means, the analog signal indicating the position of a wafer disposed on the surface of the paddle. Further included is an arrangement for signaling the robot to compensate for the particular position of the wafer on the paddle by adjusting the position of the paddle with respect to the quartz boat. Another feature lies in the fact that sensing notches are disposed along the front, right-side and left-side edges of said paddle, each of the sensing notches having a sensor device and associated emitter means disposed on opposite sides of the sensing notches in such a manner as to permit detection of the position of the slots in the quartz boat stacking rods lying adjacent to respective sensing notches.

11 Claims, 4 Drawing Sheets

APPARATUS AND PROCESS FOR POSITIONING WAFERS IN RECEIVING DEVICES

BACKGROUND OF THE INVENTION

The novel apparatus and process of the present invention is particularly useful in the loading and/or unloading of silicon or other semiconductor wafers from wafer-holding cassettes to quartz boats before placing the wafers into a diffusion furnace.

The present invention provides an apparatus for transporting a wafer comprising a robot and a paddle or end-effector. The improvement comprises a sensor means disposed on the surface of the paddle, the sensor means producing electrical analog signals which represent the wafer position on the paddle, connected to a microprocessor operable to process digital signals, which have been converted from the analog signals.

A further feature of the present invention includes an apparatus for mapping the position of slots in the stacking rods of a quartz boat, thereby to establish reference points for the precise placement or positioning of wafers in the slots. This feature comprises sensing notches disposed along the front, right-side and left side edges of the paddle for detecting the relative position of the slots in the stacking rod lying adjacent to the sensing notches.

It is desirable to rapidly transfer semiconductor wafers from holding cassettes to quartz boats before they are introduced into a diffusion furnace, and vice versa, without introducing contamination onto the surfaces of the wafers. Such contamination often results during wafer placement in the quartz boats, from the wafers scraping against the slots into which they are placed. These slots are only slightly wider than the wafers themselves, and thus it has been difficult to achieve sufficiently precise placement as to avoid such scraping altogether.

Misalignment or misorientation of the wafers and the quartz boats occur as each is moved into position during loading or unloading. Wafers will typically move off center while the wafer is removed from the cassette and transferred to the quartz boat. Misaligned wafers will normally scrape against the slots of the quartz boat resulting in particulate contaminants on the surface of the wafers. Scraping can also occur if the quartz boats are misaligned in relation to the paddle such that the wafers contact the slots during loading.

The problem of misalignment of wafers during the loading of quartz boats prior to insertion into a diffusion furnace has been addressed in U.S. Pat. No. 4,682,928 (Foulke et al.), issued July 28, 1987, and U.S. Pat. No. 4,493,606 (Foulke et al.), issued Jan. 15, 1985.

Both of these patents attempt to overcome the problem of misalignment by providing on the paddle a sensor for sensing the alignment of the paddle with some known location, recognizable by a known variation in shape, such as a slot onto which a semiconductor wafer is placed by the paddle. Sensing is done in advance of placement and is accomplished by transmitting an energy beam (e.g., light) along a path intersecting with slots in a holder (paddle) for semiconductor wafers. The output of the sensor is processed to determine each location of the holder at which the wafer paddle is so aligned that a wafer supported thereon would be received at the center of the slots. These alignment locations are stored and used later on to align the holder when wafers are actually transferred to the quartz boat. Two sensors, one for the slots in each of two rails in the holder, are provided on the wafer paddle; and mirrors on a central portion of the paddle reflect light travelling between source and sensors located on outer portions of the paddle, only the central portion actually being received inside the boat.

Foulke et al. '928 and '606 detect the location of the slots by sensing the variation in light intensity at the light sensors. Light travelling from the sources is reflected by mirrors disposed on the paddle back to the sensors disposed on the quartz boat. That light path is blocked except when a slot is encountered. Maximum light transmission occurs at the precise center of each slot. Location of alignment between the paddle and the ten slots are determined from the outputs of the encoder and the light sensors. The ten locations are then processed to determine what wafer rotation angle theta is required to cause wafers carried by the paddle to be aligned with the slots. Once the wafer misalignment angle theta has been determined, the paddle is rotated about the Y axis by precisely that angle.

The following patents also discuss various aspects of wafer misalignment during handling: U.S. Pat. No. 4,765,793 (Goddeau), issued Aug. 23, 1988; U.S. Pat. No. 4,024,944 (Adams et al.), issued May 24, 1977; and U.S. Pat. No. 4,713,551 (Layman et al.), issued Dec. 15, 1987. None of these patents specifically deal with the overcoming of the misalignment of wafers during loading and/or unloading from quartz boats.

Unfortunately, the sensor system disclosed in the Foulke et al. patents does not contemplate the misalignment of the wafer on the paddle itself, nor the combination of quartz boat and wafer misalignment simultaneously. The wafer may be sitting anywhere (i.e., left, right, or in/out) in its cassette due to its handling. Therefore, it is desirable to know where the wafer is when it is picked up by a paddle in order to avoid sliding or bumping as it is loaded into a quartz boat. Moreover, the wafer may also become off center as it is removed from the cassette itself.

The present inventor has developed a unique apparatus and process for overcoming scraping of semiconductor wafers during the loading or unloading of quartz boats due to misalignment of wafers on a paddle, misalignment of the slots in a quartz boat relative to the position of the paddle, or both.

SUMMARY OF THE INVENTION

An apparatus for transporting a semiconductor wafer comprising a robot and a paddle, the improvement comprising sensor means disposed on the surface of the paddle, the sensor means being electrically connected to a microprocessor which is capable of converting and digitizing analog signals sent from the sensor means, the analog signals indicating the relative position of a wafer disposed on the surface of the paddle.

The sensor means includes at least two optical sensors which, in one embodiment, are disposed apart 90 degrees circumferentially. However, it is preferable that the sensor means comprise at least four optical sensors disposed about the respective four corners of the paddle, such that a wafer disposed on the paddle covers a portion of each optical sensor.

The optical sensor is a photosensitive material which generates an analog signal equivalent to the percentage of the photosensitive material exposed to a light source. The optical sensor is activated by a light source, the light source being either direct lighting means or a mirror reflection of such lighting means.

The microprocessor is preferably serially connected to a host processor and the host processor is electrically connected to a robot arm to which a compensating signal is sent from the host processor, typically by way of a suitable digital-to-analog converter, to adjust or correct for the misalignment or misorientation of the wafer disposed on the paddle, thereby to insure the precise positioning of such wafer in an appropriate receiving slot of a quartz boat.

An additional object of the present invention is to provide an apparatus for detecting the relative position of the paddle with respect to the slots in the three stacking rods of a quartz boat used for stacking wafers comprising: a paddle with sensing notches disposed along the front, right-side and left-side edges of the paddle, each of the sensing notches comprising a sensor means and emitter means which are disposed about the sensing notches in such a manner as to permit detection of the position of the slots in the particular stacking rod lying adjacent to each sensing notch.

Another object of the present invention is to provide an apparatus for loading and/or unloading wafers from a holding cassette to a quartz boat without scraping the wafer on the slots contained in the quartz boat, the loading apparatus comprising a robot arm and a paddle, the improvement comprising: wafer sensor means disposed on the surface of the paddle, the wafer sensor means being electrically connected to a microprocessor which converts and digitizes analog signals from the wafer sensor means, the analog signals indicating the position of a wafer disposed on the surface of the paddle; sensing notches disposed along the front, right-side and left-side edges of the paddle, each of the sensing notches comprising a slot sensor device and emitter means which are disposed about the sensing notches in such a manner as to permit detection of the position of the slots in the particular stacking rod of the quartz boat lying adjacent to each sensing notch; and means for adjusting the position of said paddle with respect to the receiving device (quartz boat) to compensate for any misorientation in the position of the wafer with respect to the center of the paddle.

Both the wafer sensor means and the slot sensing means are connected to a microprocessor which converts and digitizes the analog signals being transmitted by both arrangements. The microprocessor is preferably connected to a host processor which operates to compare (1) signals representative of the mapping of the slots on the rods of the quartz boats by the sensing notches with (2) signals representative of wafer position on the paddle obtained from the wafer sensor means. The host processor sends suitable compensating or correcting signals to the robot arm in order to adjust the movement of the paddle to correct for any misalignment of the wafer disposed on the paddle.

DESCRIPTION OF THE PREFERRED EMBODIMENTS

The novel apparatus and process of the present invention is particularly useful in the loading and/or unloading of silicon or other semiconductor wafers from wafer holding cassettes to quartz boats before placing the wafers into a diffusion furnace or the like.

The present invention provides an apparatus for transporting and precisely positioning a wafer so as to avoid damage to the wafer. The improvement comprises a paddle controlled in its movement by a robot; a sensor means is disposed on the surface of the paddle, the sensor means being electrically connected to a microprocessor which is capable of converting and digitizing analog signals transmitted from the sensor means, the analog signals indicating the position of the wafer disposed on the surface of the paddle.

A further feature of the present invention, as noted previously, includes an arrangement for mapping the position of slots in the stacking rods of the quartz boat relative to the paddle. This feature involves having sensing notches disposed along the front, right-side and left side edges of the paddle so that the position of the slots in the stacking rod, which slots lie adjacent to the respective sensing notches, can be detected.

Figure 1:
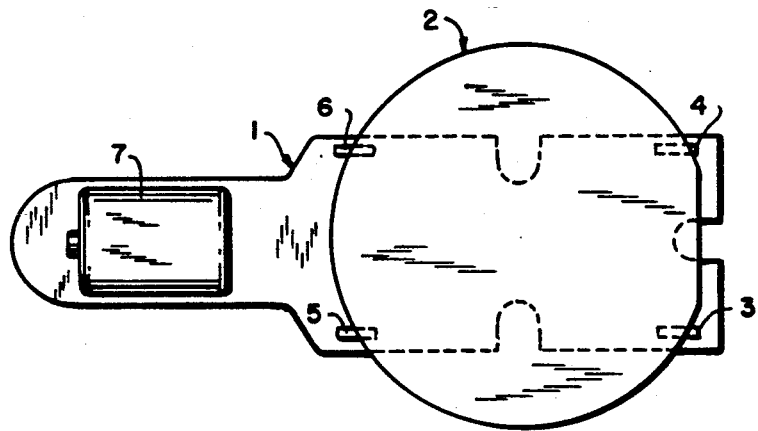
FIG. 1 is a top plan view of a paddle containing four optical sensors and a wafer in accordance with the present invention.
Figure 2:
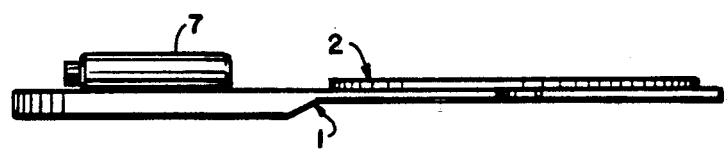
FIG. 2 is an elevation view of the paddle shown in FIG. 1.

The features of the present invention can best be described while referring to the attached drawings. FIG. 1 depicts an apparatus for transporting and precisely positioning a semiconductor wafer 2 comprising a robot, not shown here, and a paddle 1. The improvement includes sensor means in the form of individual sensors 3, 4, 5, and 6 disposed on the surface of paddle 1, such sensors being electrically connected to a microprocessor 7 which is capable of converting and digitizing analog signals from sensors 3, 4, 5, and 6; whereby different values of the analog signals in combination indicate the different coordinate or X, Y, and Z positions of wafer 2 disposed on the surface of paddle 1.

As previously noted, the wafer sensor means may include at least two or three optical sensors disposed radially opposite to one another. However it is preferable that the sensor means be at least four optical sensors 3, 4, 5, and 6 disposed about the four corners of paddle 1, such that wafer 2 disposed on paddle 1 covers a portion of each optical sensor 3, 4, 5, and 6, as shown by the dotted lines in FIG. 1. The optical sensors typically have a photosensitive area of about 8.7 × 2.3 mm and are embedded in paddle 1.

Figure 3:
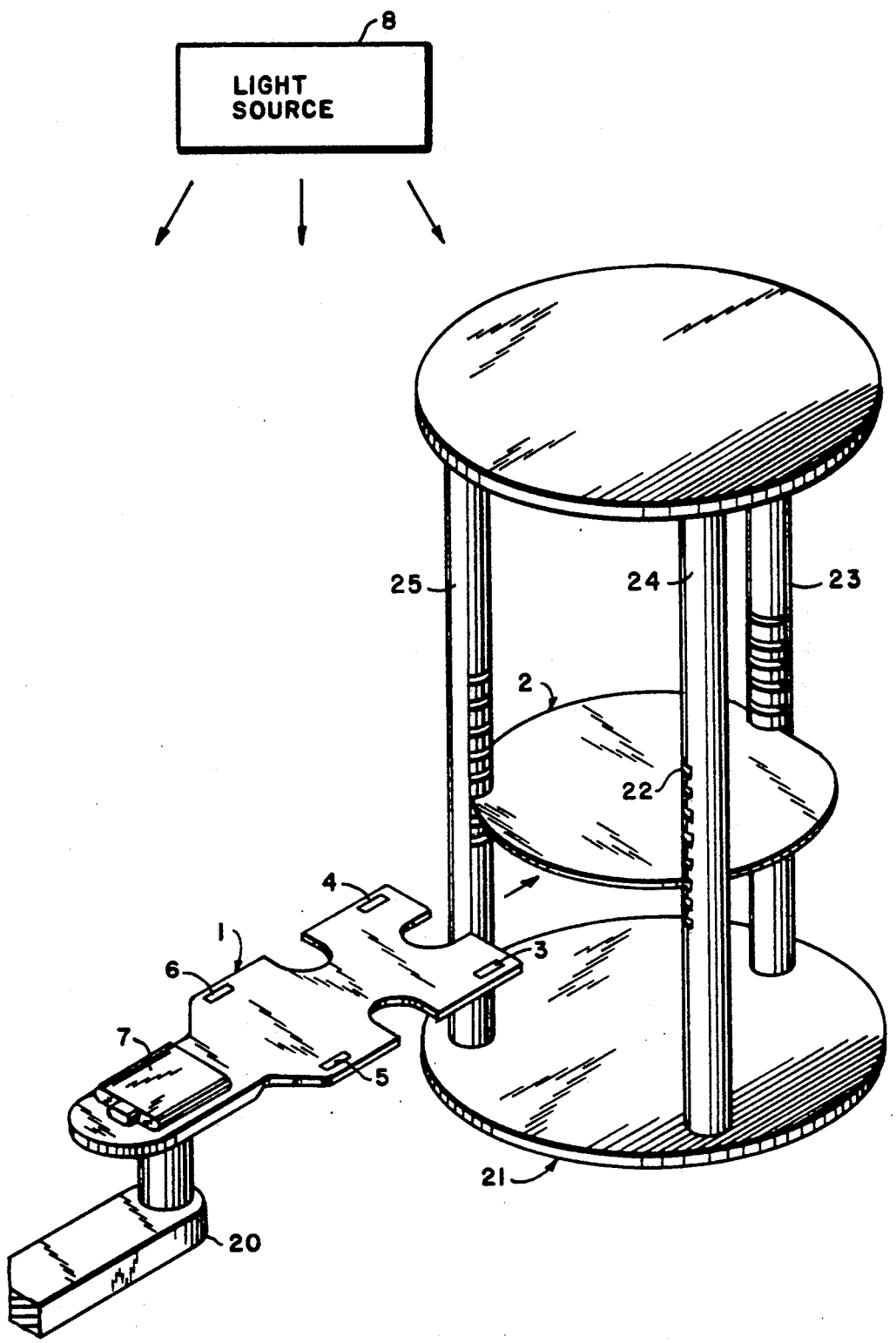
FIG. 3 is a top-front perspective view of a quartz boat with stacking rods and slots; and a wafer delivered from a paddle in accordance with the present invention.

Optical sensors 3, 4, 5, and 6 are constituted of a photosensitive material which generates an analog signal equivalent to the percentage of the photosensitive material exposed to a light source 8, shown in FIG. 3. Optical sensors 3, 4, 5, and 6 are activated by light source 8, light source 8 being either a direct light source or a mirror reflection thereof.

Figure 6:
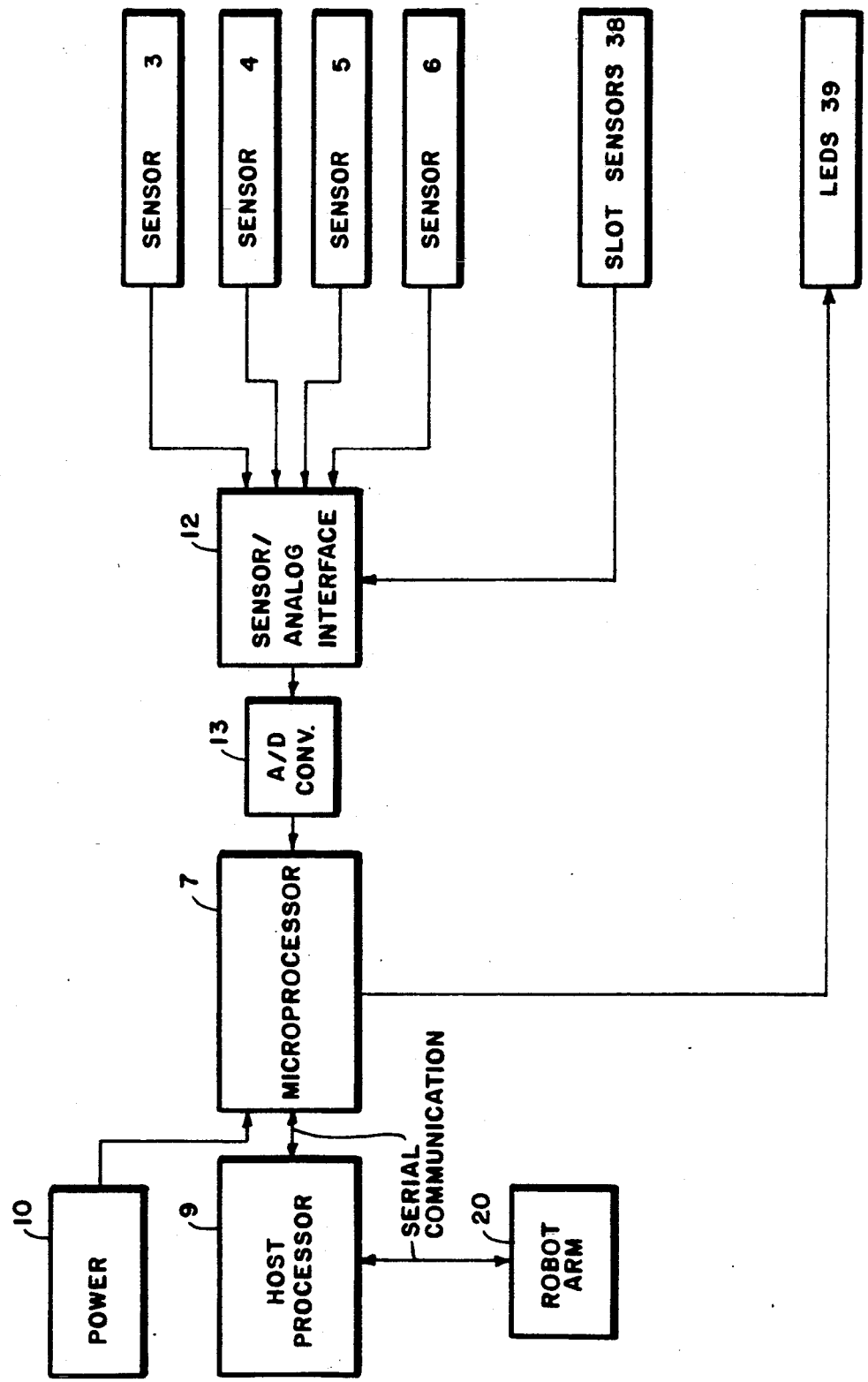
FIG. 6 is a block diagram in accordance with a preferred embodiment of the present invention.

As seen in FIG. 6, microprocessor 7 is serially connected, by means of an RS-232 device or the like, to host processor 9. Power from source 10 is shown simply connected to microprocessor 7, but it is, of course, also connected by suitable bus bar to all components requiring power.

FIG. 3 demonstrates the relationship of paddle 1 with robot arm 20 and quartz boat 21. After paddle 1 retrieves wafer 2 from a holding cassette, not shown, it moves toward quartz boat 21. As paddle 1 approaches quartz boat 21 it passes below light source 8 which is detected by optical sensors 3, 4, 5, and 6. The analog signals generated by optical sensors 3, 4, 5, and 6 are sent to microprocessor 7 by way of analog-to-digital converter 13, which can be integrated, if desired, so as to form part of microprocessor 7. The analog signal detected by each of optical sensors 3, 4, 5, and 6 is directly proportional to the percentage by which each optical sensor is covered by wafer 2. This permits the mathematical calculation by programmed microprocessor 7 of the amount by which wafer 2 is off center on paddle 1, based on the differences in the four analog signals detected.

FIG. 6 is a block diagram of the primary components used in detecting the position of the wafer 2 on paddle 1. In this FIG. 6 four sensors are shown, although it is to be clearly understood that any number of sensors may be used as would be apparent to those skilled in the art. The analog signals from the sensors 3, 4, 5, and 6 are sent to a sensor/analog interface 12 and an A/D converter 13 before being sent to the microprocessor (CPU) for determining the position of the wafer disposed on the paddle. The microprocessor 7 is powered by any conventional power source 10. The digitized signals from the microprocessor are thereafter sent serially to a host processor which sends a compensating or correcting signal to the robot arm 20 in order to adjust the movement of the paddle to compensate for any misalignment of the wafer in its orientation or position on the paddle.

Figure 7:
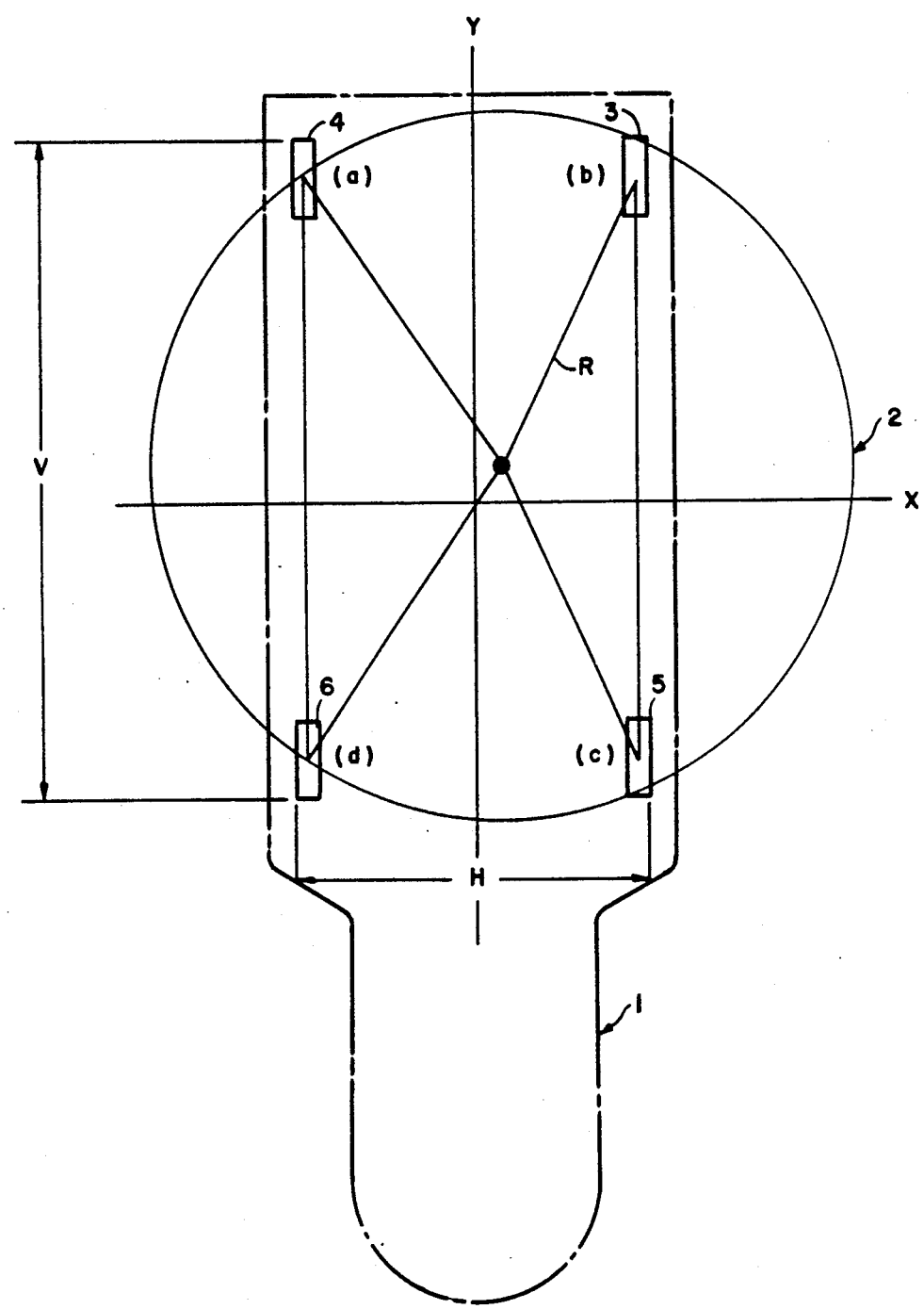
FIG. 7 is a geometrical diagram depicting one method of determining the orientation of a wafer disposed on a paddle with respect to the paddle center, using four optical sensors in accordance with one embodiment of the present invention.

The position of wafer 2 on paddle 1 can be calculated along the x-axis and y-axis, as shown in FIG. 7, using the following equations:

$$x = \frac{(a - (b + c - d))(2V - (a + b + c + d))}{8H};$$

and $$y = \frac{d - a + c - b}{4}$$

where V is the longitudinal distance from the end of optical sensor 4 or 3 to the end of optical sensor 6 or 7, respectively; H is the horizontal distance from optical sensor 4 or 6 to optical sensor 3 or 5, respectively; and a, b, c, and d are the converted and digitized signals from each of optical sensors 4, 3, 5, and 6, respectively.

It will be understood by those skilled in the art that the calculation of the position of wafer 2 with respect to paddle 1 is performed by microprocessor 7. Such is accomplished by suitable programming the microprocessor to solve the equations above listed, thereby obtaining the X and Y coordinates for wafer position.

As shown in FIG. 3, after the position of wafer 2 disposed on paddle 1 is determined by microprocessor 7, a signal is sent to a host processor which in turn sends a compensating signal to the robot arm 20 in order to adjust the movement of paddle 1 to compensate for the misalignment of wafer 2 disposed on paddle 1. Thereafter, paddle 1 loads wafer 2 into quartz boat 21 via selected slots 22 on stacking rods 23, 24, and 25.

Before any wafer loading occurs, it is necessary to map the position of the quartz boat 21. The quartz boat is mapped by detection of the position of various slots 22 in the stacking rods of the quartz boat. At least several slots from each stacking rod should be detected in order to establish the general position of the quartz boat.

Figure 4:
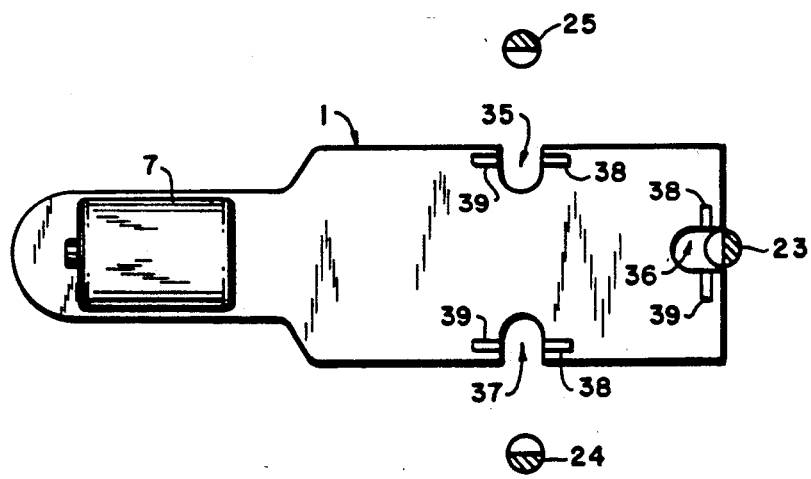
FIG. 4 is a top plan view of the feature of the invention which permits mapping of the position of the slots in the rods of the quartz boat; in particular, it illustrates the sensing notches and the sensor device and emitting means adjacent each notch for such purpose.
Figure 5:
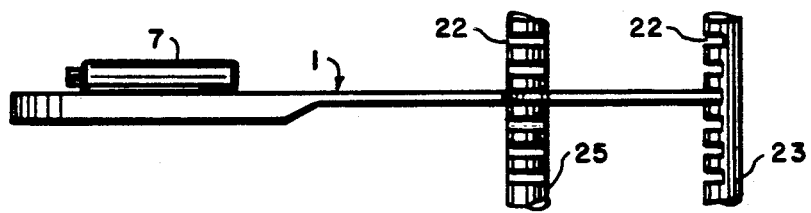
FIG. 5 is a fragmentary elevation view of the paddle and rods shown in FIG. 4.

Mapping is accomplished, as shown in FIGS. 4 and 5, and referring also to FIG. 3, by means of an apparatus capable of detecting the position of slots 22 in stacking rods 23, 24, and 25 of the quartz boat 21 used for stacking wafers. Such apparatus includes the paddle, previously seen, but here shown to include sensing notches 35, 36, and 37 disposed along front A, right-side B, and left-side C respectively of paddle 1. Each sensing notch 35, 36, and 37 comprises a sensor means 38 and emitter means 39 which are disposed about sensing notches 35, 36, and 37 in such a manner as to permit detection of the position of slot 22 in the stacking rods 23, 24, or 25 lying adjacent to its respective sensing notch 35, 36, or 37.

Analog signals are generated from each sensing notch 35, 36, and 37 separately. That is, in order to detect the position of slot 22 in a given stacking rod, such as rod 24, paddle 1 is positioned such that sensing notch 36 is disposed about rod 24. A pulsed light is continuously emitted from emitter means 39 and detected via sensor device 38. However, the light pulses will be deflected if sensing notch 36 moves sufficiently beyond slot 22 into rod 24. After the position of slot 22 in rod 24 is detected, then the same procedure is repeated in measuring slots 22 in rods 23 and 25 via sensing notches 35 and 37, respectively. It should be noted that paddle 1 detects the position of each slot 22 separately, not simultaneously.

Each of the sensor devices 38 is connected (FIG. 6), by way of interface 12 and A/D converter 13, to microprocessor 7 which in turn is serially connected to the host processor 9 in the same manner as sensors 3, 4, 5, and 6 were connected. Also, each of the respective emitting means, in the form of LEDs 39 seen in FIG. 6 is connected, for the purpose of being supplied with pulse power, to microprocessor 7. The host processor stores digitally in memory the mapped reference positions obtained as just described. The ability of the paddle to move in three dimensions and the position of the sensing notches in two perpendicular orientations allows the mapping of the position of the quartz boat along the X, Y and Z axes.

It will be appreciated that for purposes of precisely positioning a wafer in the slots 22 of the rods of the quartz boat, it is preferable to have optical sensors, as already described, on paddle 1 to determine the position of a wafer mounted thereon, as well as sensing notches on the paddle for mapping the position of the slots in the stacking rods of the quartz boat to be loaded or unloaded with such wafers.

While we have shown and described several embodiments in accordance with our invention, it is to be clearly understood that the same are susceptible to numerous changes and modifications apparent to one skilled in the art. Therefore, we do not wish to be limited to the details shown and described but intend to show all changes and modifications which come within the scope of the appended claims.

What is claimed is:

1. An apparatus for transporting and precisely positioning a semiconductor wafer relative to a receiving device, comprising:
   means for holding said wafer and placing it into said receiving device;
   a sensor means, comprising at least two spaced sensors disposed on said means for holding, for producing electrical analog signals whose value is dependent on the position of said wafer with respect to the center of said holding means;
   means for converting said analog signals to digital signals
   a digital processor for processing said digital signals to determine a given position of a wafer; and
   means couple to said digital processor for compensating for any misalignment in the position of said wafer with respect to the center of said holding means by correspondingly adjusting the movement of said holding means with respect to said receiving device, thereby to insure the precise positioning of said wafer in an appropriate receiving slot of said receiving device.

2. The apparatus in accordance with claim 1, in which said means for holding and placing the wafer is a paddle, said digital processor is a microprocessor, said receiving device is a quartz boat, said means for compensating comprises means for adjusting the position of said paddle including a robot arm; and further including means for transmitting compensating signals to said robot arm.

3. The apparatus in accordance with claim 1, in which said sensor means comprises optical sensors.

4. The apparatus according to claim 1, wherein said holding and placing means have four corners and said sensor means comprises at least four optical sensors disposed about the respective four corners of said holding means, such that a wafer disposed on said holding means covers a portion of each said optical sensor.

5. The apparatus according to claim 4, wherein said optical sensors include a photosensitive material which generates an analog signal equivalent to the percentage of said photosensitive material exposed to a light source.

6. The apparatus according to claim 1, further comprising a sensor/analog interface, and an A/D converter, the latter being connected to said digital processor.

7. The apparatus according to claim 2, in which said microprocessor is serially connected to a host processor.

8. The apparatus according to claim 7, in which said host processor is connected to said robot arm, and in which a compensating signal is sent from said host processor to said robot arm in order to adjust the position of said paddle to compensate for the misorientation of said wafer disposed on said paddle.

9. The apparatus according to claim 4, including means for calculating the position of said wafer on said holding means along the x-axis and y-axis using the following equations:

$$x = \frac{(a - (b + c - d))(2V - (a + b + c + d))}{8H}$$

and $$y = \frac{d - a + c - b}{4}$$

where V is the longitudinal distance from the end of one sensor to another sensor; H is the horizontal distance from one sensor to another sensor; an da, b, c, and d are the converted and digitized signals from each of the four optical sensors, respectively.

10. The apparatus according to claim 5, wherein said optical sensors are activated by a light source, said light source being either direct lighting means or a mirror reflection rom the lighting means.

11. The apparatus according to claim 3, wherein said optical sensors are embedded in said holding means and positioned so that a centered wafer will cover predetermined portions of each said optical sensor.

* * * * *